United States Patent [19]

Bletz

[11] Patent Number: 4,639,134
[45] Date of Patent: Jan. 27, 1987

[54] PROCESS AND CIRCUIT ARRANGEMENT FOR AMPLIFYING AN INPUT CURRENT

[75] Inventor: Walter Bletz, Braunfels, Fed. Rep. of Germany

[73] Assignee: Ernst Leitz Wetzlar GmbH, Wetzlar, Fed. Rep. of Germany

[21] Appl. No.: 617,551

[22] Filed: Jun. 5, 1984

[30] Foreign Application Priority Data

Jun. 15, 1983 [DE] Fed. Rep. of Germany ....... 3321503

[51] Int. Cl.⁴ .............................. G01J 1/44; G01J 1/46
[52] U.S. Cl. ................... 356/223; 250/214 P; 330/59; 330/308; 354/410; 354/425; 356/226
[58] Field of Search ........................ 356/226, 223, 218; 330/59, 105, 151, 308; 354/424–429, 410, 459, 463; 250/214 A, 214 P, 214 L

[56] References Cited

U.S. PATENT DOCUMENTS

| 4,247,186 | 1/1981 | Uchidoi et al. ............... 356/233 X |
| 4,309,090 | 1/1982 | Yamada ........................... 356/266 X |
| 4,459,007 | 7/1984 | Nemoto et al. .................... 354/459 |

FOREIGN PATENT DOCUMENTS

| 3003275 | 8/1980 | Fed. Rep. of Germany . |
| 3137725 | 5/1981 | Fed. Rep. of Germany . |
| 3230543 | 3/1983 | Fed. Rep. of Germany . |

OTHER PUBLICATIONS

Sedra and Smith, "Micro-Electronic Circuits", CBS College Publishing, 1982, pp. 84–85.

Primary Examiner—Vincent P. McGraw
Attorney, Agent, or Firm—Schwartz, Jeffery, Schwaab, Mack, Blumenthal & Evans

[57] ABSTRACT

To amplify an input current present at the input of a circuit arrangement with a feedback-coupled operational amplifier, two virtually equal potentials are built up in two different current paths with a common summing point. By means of the potentials, a current flow is produced for each current path. The current flow in one current path is determined by the input current, and the current in the second current path determined by a suitable choice of the impedances on the first and second current paths. The current in the second current path is greater by a multiple than the current in the first current path.

16 Claims, 21 Drawing Figures

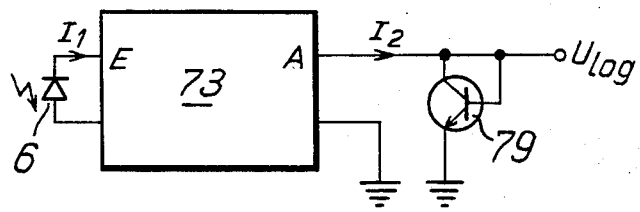
Fig. 11
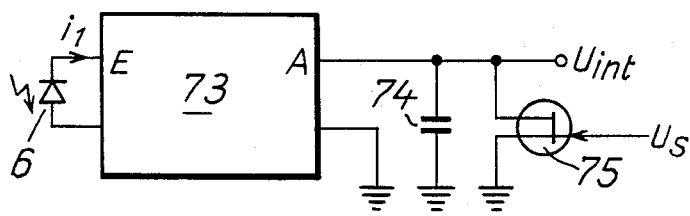
Fig. 12
Fig. 13
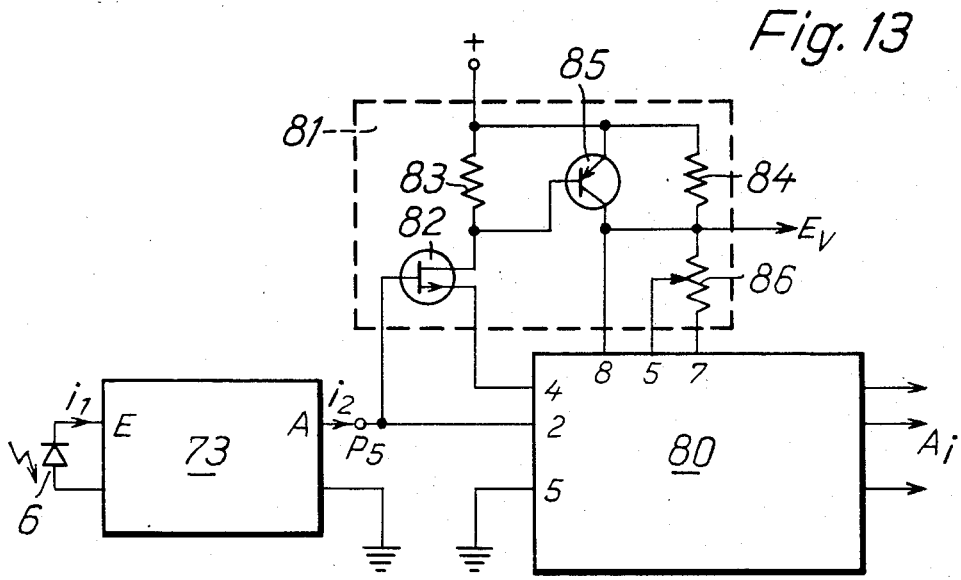

PROCESS AND CIRCUIT ARRANGEMENT FOR AMPLIFYING AN INPUT CURRENT

BACKGROUND OF THE INVENTION

The present invention relates to a process and circuit arrangement for amplifying an input current present at the input of a feedback-coupled operational amplifier.

In processes or circuit arrangements of this kind, currents, which are, for example, produced by a photoelectric transducer element when acted on by light, are amplified such that they can be further processed without difficulty for control, indication and/or drive purposes.

Amplifier circuits for this purpose are known, e.g., from German Offenlegungsschrift No. 3,003,275 (FIG. 2a) and German Offenlegungsschrift No. 3,137,725 (FIG. 2), in which circuits logarithmic converting diodes, or transistors connected as diodes, are present in the circuit of the operational amplifier contained in the circuit and compress the input current.

An amplifier circuit of a reflex photometry device is known from German Offenlegungsschrift No. 3,230,543 (FIG. 4), in which amplifier the anode and the cathode of a transducer element are connected to the non-inverting and the inverting input, respectively, of an amplifier. The non-inverting input is connected to the collector of an NPN transistor, the collector of which is connected to the base in order to act as a diode which provides logarithmic compression. The NPN transistor has its emitter grounded, and the inverting input of the amplifier is connected to its output. The latter is connected to two further NPN transistors, which form a current mirror circuit and make possible a logarithmic expansion to twice the current supplied by the transducer element.

After the conversion, according to these known devices, of the photocurrent into a logarithmic current, the latter can be further added, for example, to the voltages corresponding to the film sensitivity. A greater current then arises on inverse delogarithmic conversion of this voltage.

However, as described, for example, in German Offenlegungsschrift No. 3,003,275, the added voltage must have a given temperature behavior, closely tied to the temperature behavior of the logarithmic conversion circuit and inverse logarithmic conversion circuit. Such a tied relationship, however, means a larger expenditure in semiconductors, amplifiers, and potentiometers, in order to be able to add the voltages.

From such an expenditure, however, there results an indirect worsening of the frequency response. Apart from this, it is sometimes desired to provide a fixed current amplification factor which cannot be varied.

SUMMARY OF THE INVENTION

One object of the present invention is to provide a circuit arrangement and a process by which an input current can be amplified.

A further object of the present invention is to provide a circuit arrangement and method in which the amplification factor can be varied to afford the possibility to, for example, correct for varying conditions.

Yet another object of the invention is to provide a circuit arrangement and method which are relatively simple, yet provide excellent results in use.

The process according to the invention comprises forming two virtually equal voltages by use of an operational aplifier and forming two current paths having a common connection point using, respectively, the equal voltages and resistances or impedances. The current in one current path is determined solely by the input current, while the current in the other current path is determined by the ratio of the resistances or the impedances in the current paths and also the magnitude of the input current. The currents of the two current paths are added at the common connection point. A variation of the ratio of the currents in the two current paths, and hence in the current amplification, may be produced by introduction of a potential difference.

The circuit arrangement comprises a feedback-coupled operational amplifier having an input with two input terminals, the current being present at the input. A first current path including a resistance or impedance is connected between one of the input terminals of the operational amplifier and a summing point. A second current path including a resistance or impedance is connected between the other input terminal of the operational amplifier and the summing point. The magnitude of the two currents in the two current paths relative to each other are determined by the ratio of magnitudes of the resistances or impedances, and the first current path is connected such that the current therein is determined by the input current of the circuit arrangement, and wherein the sum of the currents of both current paths is available for use at the summing point.

A load may be connected between the summing point and ground, or the load may be connected between the summing point and an output of the operational amplifier. Alternately, the load may be connected directly into one of the current paths.

At least one of the resitances or impedances may have a nonlinear current/voltage characteristic, and the resistances or impedances may be formed by parts of a semiconductor array.

A potential displacement may be introduced in at least one of the current paths for varying the ratio of the currents flowing in the current paths. Also, means for compensating for temperature variations may be included.

A photoelectric transducer element may be provided for producing the current to be amplified. The photoelectric transducer element may be connected between the two input terminals of the operational amplifier.

The resistances or impedances may comprise capacitances and resistances in both current paths, the value of the ratio of the capacitances being inversely proportional to the value of the ratio of the resistances in the current paths. Further, an integrating capacitor may be provided in the output of the circuit.

The circuit arrangement may be used in combination with a photographic apparatus, wherein the current to be measured is indicative of a light-sensitive value. The photographic apparatus may comprise a photographic camera, and a switch may be included in at least one of the current paths for setting a film-sensitivity value. In particular, the impedances of the current paths may comprise diodes and the switch may be connected to switch on or off at least one diode in at least one of the current paths in order to set the film-sensitivity.

BRIEF DESCRIPTION OF THE DRAWINGS

The invention is illustrated schematically in the drawings, and is described in detail below.

In the drawings:

FIGS. 11–16 show examples of the application of the circuit arrangement according to the invention;

DETAILED DESCRIPTION OF PREFERRED EMBODIMENTS

According to the method of the invention:

(a) two virtually equal voltages are formed by means of the operational amplifier, (b) two current paths are built up by means of these voltages with respect to a common connection point, the current in the one current path being determined solely by the input current, while the current in the other current path is determined by the ratio of the resistances and/or impedances in the current paths and also the magnitude of the input current, and (c) the currents of the two current paths are added.

A circuit arrangement according to the invention for carrying out the process is distinguished in that resistances and/or impedances are provided in a first current path between an input of an operational amplifier and a summing point and also in a second current path between the second input of the operational amplifier and the said summing point, the magnitudes of the two currents in the two current paths being determined relative to each other by the ratios of the magnitudes of the said resistances and/or impedances, the current in the first current path being determined by the input current of the circuit arrangement, and that the (amplified) sum of the currents of both current paths is present at the summing point.

Figure 1:
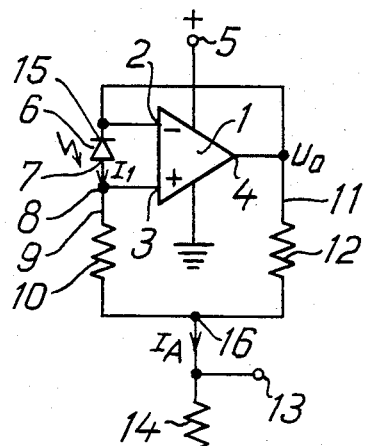
FIG. 1 shows a circuit diagram of the principle of the circuit arrangement according to the invention.

In FIG. 1 an operational amplifier is denoted by 1, and its inverting and non-inverting inputs by 2, 3 respectively, and its output by 4. The operational amplifier 1 obtains operating current from a voltage source 5.

A photoelectric transducer element 6 is connected by its lead 7 to the non-inverting input 3 of the operational amplifier 1 via a point 8. A resistance 10 lies in a first current path 9 starting from the non-inverting input 3, and a further resistance 12 is connected in a second current path 11 starting from the output 4 of the operational amplifier 1.

The current $I_1$, produced when the photoelectric transducer element 6 is acted on by light, is fed via the resistor 10 to a summing point 16 and thus to the output 13 of the circuit arrangement and to a load 14.

Since the inverting input 2 of the operational amplifier 1 is connected to the other terminal 15 of the photoelectric transducer element 6 and to the output 4 of the amplifier, the photoelectric transducer element 6 is operated in short-circuit. Hence there is available at the output 4 of the operational amplifier 1 virtually (practically) the same potential as at the point 8. An amplified current $I_A$ arises due to the connection of the output 4 of the operational amplifier 1 via the resistor 12 to the summing point 16, the resistor 10 and the load 14, and according to Ohm's law:

$$I_A = I_1 + \frac{U_o}{R_2}$$

$$= I_1 + \frac{I_1 \times R_1}{R_2}$$

$$I_A = I_1 \left(1 + \frac{R_1}{R_2}\right)$$

where $R_2$=resistance 12, $U_o$=voltage between output of the operational amplifier and the point 16, $R_1$=resistance 10.

It thus results that nearly the same current flows through the resistor 10 as at the input of the whole current amplifier stage, since the operational amplifier used takes practically no current at its inputs. The magnitude of the current is determined by the diode 6.

If the magnitude of the resistor 12 is chosen smaller than that of the resistor 10, a current flows in the current path 11 which is greater by a corresponding factor than that in current path 9. The desired current amplification is thus achieved. The sum of both currents is then available at the output 13.

Figure 2:
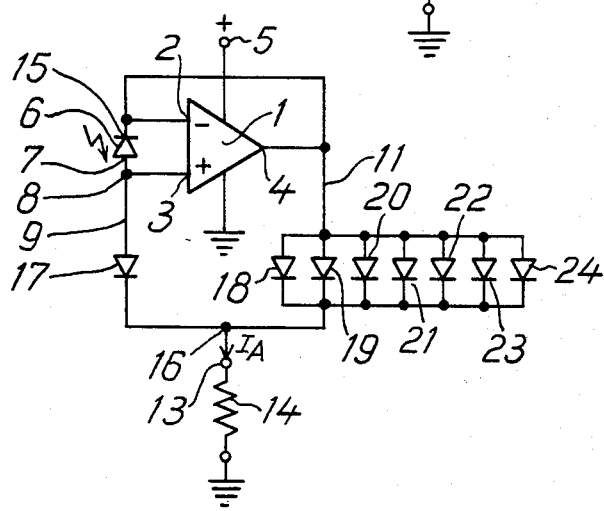
FIG. 2 shows an amplifier circuit with diodes as the resistance network.

In the circuit arrangement according to FIG. 2, diodes 17–24 are connected in the first and second current pathes 9, 11 respectively, instead of ohmic resistance 10 or 12. Here the diode 17 is connected in the first current path and the diodes 18–24, connected mutually in parallel, in the second current path 11. Hence there holds for the amplified current $I_A$:

$$I_A = I_1 \left(\frac{m+n}{m}\right),$$

where m=the number of diodes in the first current path 9 and n=the number of diodes in the second current path 11.

The diodes here are appropriately a component of a monolithic array (e.g., RCA, CA 3039). Hence all the diodes behave the same in relation to temperature or current change, i.e., these changes cause no errors in relation to the current amplfication factor.

The advantage results from the introduction of the diodes that the input current and the amplified output current can vary over a far wider range, e.g., over seven powers of ten, since voltage on the diodes changes only logarithmically, and thus lies only in the region of a few 100 mV.

To improve the dynamic behavior of the circuit arrangement, capacitors 25, 26 can be connected in parallel (FIG. 3) in the two current paths 9, 11 in the circuit arrangment described in FIG. 2. The alternating current conductive values of the capacitors 25, 26 here behave proportionally to the number of diodes in the current paths 9, 11.

Figure 3:
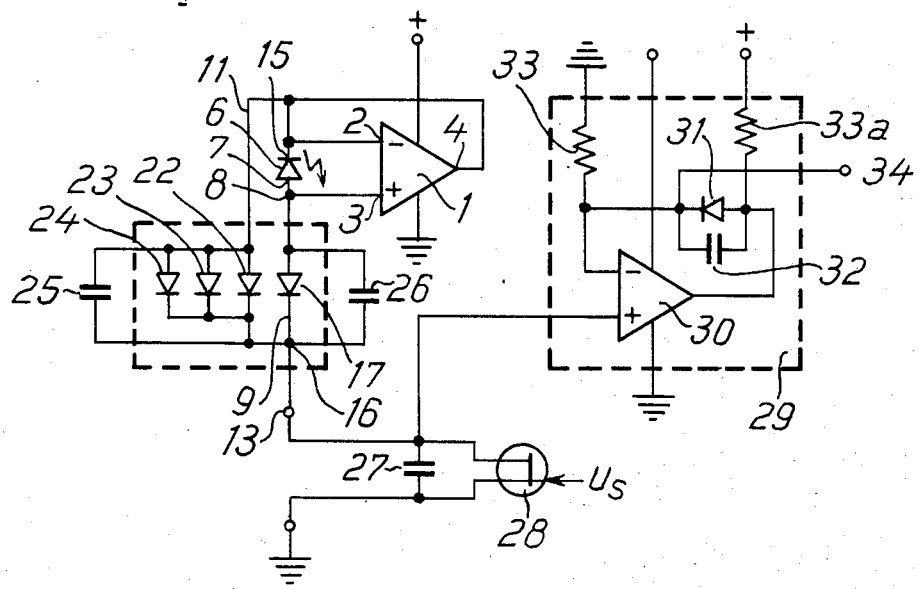
FIGS. 3–5 show examples of the combination of the circuit arrangement according to the invention with circuits which further process the amplified current.

It is furthermore shown in FIG. 3 that a capacitor 27 can be connected in the output 13 of the amplifier circuit and can be charged from the current arising from the amplifier circuit. This arrangement can, for example, find an application in flash illumination measurement through the lens in cameras. Here the capacitor 27 is first short-circuited by a field effect transistor 28. At the beginning of the flash, the field effect transistor 28 is placed at a negative voltage by a switch at point $U_s$ (not shown), so that it becomes non-conductive. Thus integration of the current at the capacitor 27 begins.

Apart from this, a follower circuit 29 is also connected to the output 13 of the amplifier circuit in FIG. 3. Follower circuit 29 consists of an operational amplifier 30, with a diode 31 and a capacitor 32 present in its feedback coupling branch, and also of resistors 33 and 33a. This follower circuit 29 ensures that the voltage of the capacitor 27 is provided at a low-impedance output 34. The components 31-33a have the object of placing the output of the operational amplifier 30 at a voltage higher than ground, since it can not quite reach this potential.

Instead of diodes, transistors connected as diodes can also be used, coupled monolithically. It is conceivable that monolithically coupled transistors of different sizes can also be used.

Figure 4:
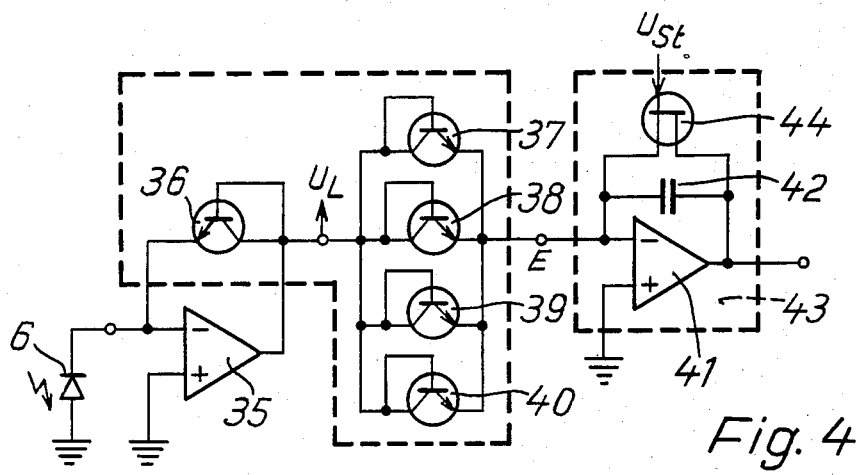

FIG. 4 shows the use of transistors in a circuit different from those shown up to now. An operational amplifier 35 is conventionally connected as a logarithmic current/voltage converter by a transistor 36 used as a diode and present in its feedback branch; it amplifies the current emitted by the photoelectric transducer element 6. Four times the photodiode current flows at the point E, since the same voltage is applied at any given time to the transistors 37-40 connected in the output of the operational amplifier 35 as to the transistor 36. A follower circuit 43, consisting of operational amplifier 41 and capacitor 42 connected in its feedback branch, follows the point E and acts as an integrator, with a field effect transistor 44 acting to release the capacitor 42.

Figure 5:
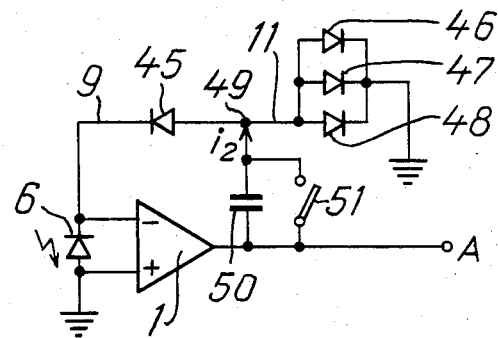

A circuit arrangement is shown in FIG. 5 which is suitable for use in a camera and in which current amplification and the integration of the flash brightness takes place in an operational amplifier stage. The arrangement consists of the photoelectric transducer element 6, the operational amplifier 1, a diode 45 present in the current path 9, the diodes 46-48 connected in current path 11, the capacitor 50 connected to the output of the operational amplifier 1 and connecting the current paths 9 and 11 at the point 49, and also a switch 51 connected in parallel with the capacitor 50. A voltage corresponding to the photodiode current flowing through the diode 45 is present at point 49. The same current simultaneously flows through each of the diodes 46-48. If the switch 51 is opened, the capacitor 50 is charged by four times the current of the photoelectric transducer element 6.

Figure 6:
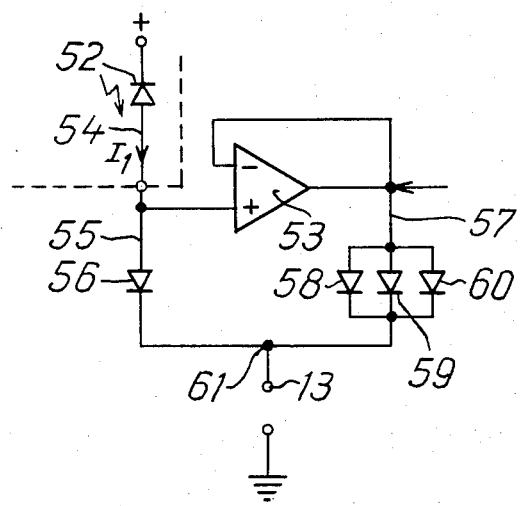
FIG. 6 shows a circuit arrangment according to the invention with a photoelectric transducer element in short circuit voltage operation.

A current $I_1$ flowing between the positive and negative poles of a supply voltage is to be amplified by the circuit arrangement shown in FIG. 6. The current $I_1$ to be amplified is produced, in this circuit example, by a photoelectric transducer element 52 which is operated in reverse voltage action. It would however also be conceivable for this current to be supplied from another current source. For amplification of the current $I_1$, this is applied to the non-inverting input of an operational amplifier 53, the output of which is fed back to its inverting input. A diode 56 is in a first current path 55 starting from one pole 54. Diodes 58-60 are connected in a current path 57 starting from the output of the operational amplifier 53. The latter diodes form an array together with diode 56. The current paths 55, 57 are brought together at the summing point 61. A current amplification lying in a very large current range is achieved at the output 13 by the connection of operational amplifier 53 into the circuit in this way.

Figure 7:
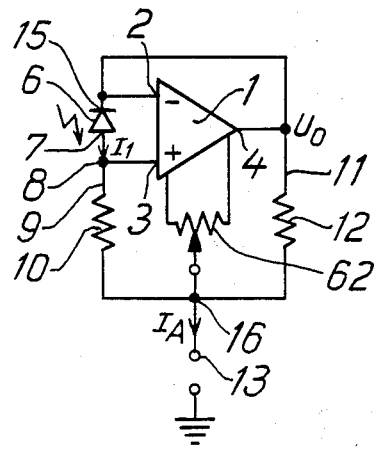
FIG. 7 shows a current amplifier circuit which is variable by means of offset equalization.

The circuit arrangement of FIG. 7 is similar in design to that of FIG. 6. However, it differs by a potentiometer 62 connected to the operational amplifier 1 for offset equalization. The current amplification can also be altered with this. If the offset voltage present at the inputs 2, 3 of the operational amplifier 1 is denoted by $V_{os}$, then:

$$I_A = I_1 + \frac{I_1 \times R_1 + V_{os}}{R_2}$$

In this equation,
$I_A$ = the output current
$I_1$ = the input current
$V_{os}$ = the offset voltage of the operational amplifier
$R_1$ = resistance 10 and
$R_2$ = resistance 12.

For equalization of current amplification, a voltage can be introduced in series with the resistance 10 or 12.

Figure 8:
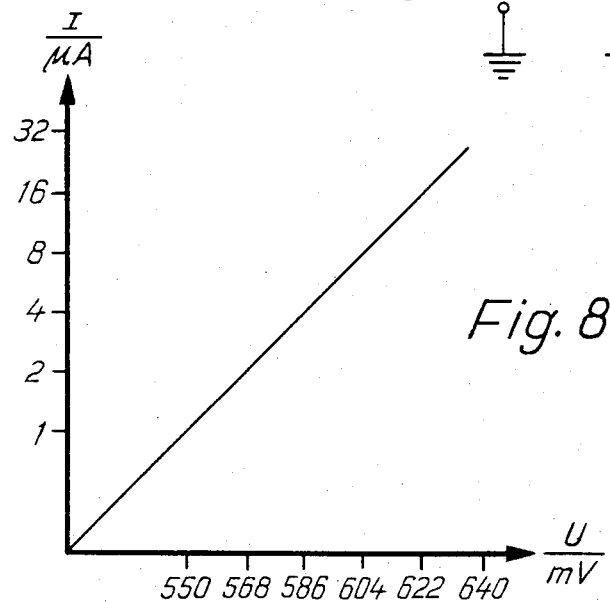
FIG. 8 shows a voltage diagram.

If an offset voltage is used in connection with a diode array network, a change of current amplification of 2 or more can easily be achieved with a voltage of a few millivolts. A diode characteristic is shown on a semilogarithmic scale in FIG. 8. If the resistance 10 is represented by a diode, as stated, then, at e.g., 8 μA, a voltage of 604 mV is set. If e.g., three diodes connected in parallel are used instead of resistor 12, and if the offset voltage = 0, an output current $I_A$ = 32 μA results.

However, if an offset of, e.g., 5 mV is set, 609 mV instead of 604 mV are now applied to the three diodes connected in parallel. Because of this, 9.7 μA now flows through each of the diodes instead of 8 μA. Hence there results an output current of $I_A' = 8$ μA + 3 × 9.7 μA = 37 μA.

Figure 9:
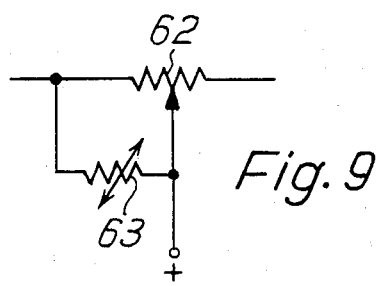
FIG. 9 shows a current amplifier circuit arrangement with a temperature equalization circuit.

When the offset voltage is temperature-independent, temperature dependence of the current amplification results in this case, due to the temperature dependence of the diode characteristic. If this is not desired, a compensating temperature dependence can be introduced for the offset voltage, as shown in FIG. 9, by connecting a temperature-compensating resistor 63 to the potentiometer 62.

Figure 10:
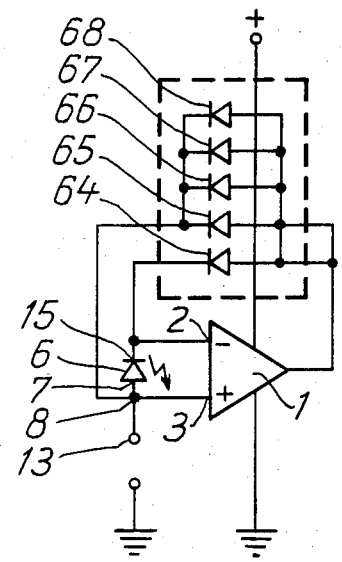
FIG. 10 shows a variation of the current amplifier circuit according to the invention.

A further variant of the amplifier circuit is shown in FIG. 10. Here also, the photoelectric transducer element is operated in short circuit. For this, its leads 8 or 15 are connected to the inverting or non-inverting inputs 2 or 3, respectively, of the operational amplifier 1. A logarithmic diode 64 is present in the feedback branch of the operational amplifier 1. The diodes 65-68 lie at virtually the same voltage as diode 64, so that at the output 13 of the whole circuit a current flows which is 5 × greater than the current emitted by the photoelectric transducer element 6.

As is known, in a camera with exposure metering through the lens, light reflected by the film or by means of a reflector is conducted to a photoelectric transducer element. This converts the received amount of light into a proportional current. A circuit arrangement 73 according to FIGS. 1-7 and 10 can be connected following such a transducer element 6 in the manner shown in FIG. 12. It amplifies the current emitted by the photoelectric transducer element 6 and feeds it to a capacitor 74, where it is integrated. The voltage now present on capacitor 74 can now be taken off at the point $U_{int}$ for further processing. A field effect transistor 75 releases the capacitor 74 for integration, as already stated with reference to FIG. 3.

The example of FIG. 11 is different. Here the circuit arrangement 73 following the photoelectric transducer element 6 receives the current produced by the photoelectric transducer element 6, amplifies it and feeds it for logarithmic conversion to a transistor 79 present at the output A of the circuit arrangement 73. After logarithmic conversion, the voltage can then be taken off at the point $U_{log}$ for further processing.

A further embodiment is shown in FIG. 13. In contrast to a camera illumination measuring circuit 80 such as is known from, e.g., German Offenlegungsschrift No. 2,822,035 (FIG. 1), in which the photoelectric transducer element 6 is directly connected at a point P5, the current amplifier circuit 73 is here connected between the photoelectric transducer element 6 and the known camera electronics. As the connection between the circuit arrangement 73 and the camera electronics 80 there is used an additional circuit arrangement 81, to be counted as part of the camera electronics and which consists of a field effect transistor 82 at the output A of the circuit arrangement 73, the resistors 83, 84 controlling its source voltage, with transistor 85 and a potentiometer 86 setting the film sensitivity. Even a low illumination density region can be measured with an exposure measuring device of such a design. If the current amplification circuit 73 and the photoelectric transducer element 6 are brought spatially close together here, independence of disturbing influences, such as, e.g., moisture in the air or other electrical disturbances, will substantially result.

It is conceivable that a separate photoelectric transducer element 6 and a current amplifier circuit 73 will respectively be provided for flash light measurement, as can for example be carried out according to FIG. 12, and for normal exposure measurement according to FIG. 11.

Figure 14:
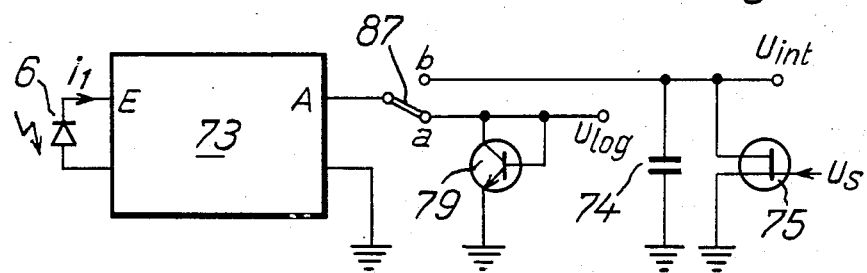

However, it is also possible to use the photoelectric transducer element 6 together with only one current amplifier circuit 73 both for flash exposure measurement and for normal exposure measurement. Changeover from one measurement to the other must then be provided, however, after the current amplifier circuit. FIG. 14 shows an example of this, in which a switch 87 with switch positions a and b is placed in the output A of the current amplifier circuit arrangement 73. In position a, the current produced by the photoelectric transduce element 6 and amplified by the amplifier circuit 73 (as already described in FIG. 11, is logarithmically converted by the transistor 79. It can be taken off at the point $U_{log}$ for further processing. If, on the other hand, the switch 87 is in position b, then the current derived from the flash and amplified (as already described in FIG. 12) flows to capacitor 74 and is integrated there. After release of the capacitor 74 by the field effect transistor 75, a voltage proportional to the flash brightness can then be picked off at the point $U_{int}$.

Figure 16:
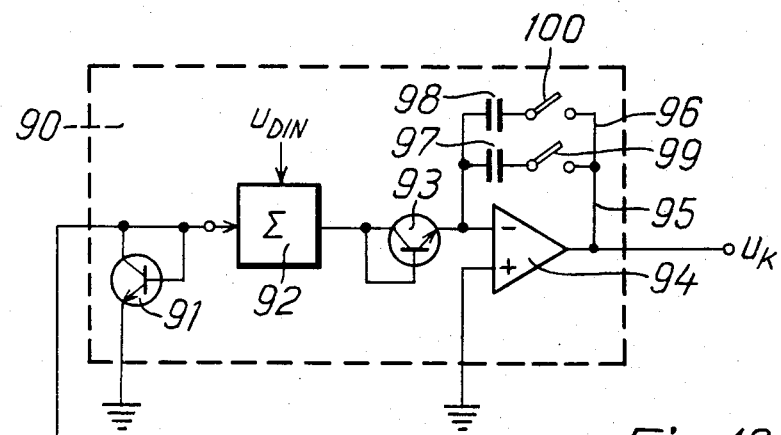
Figure 16:
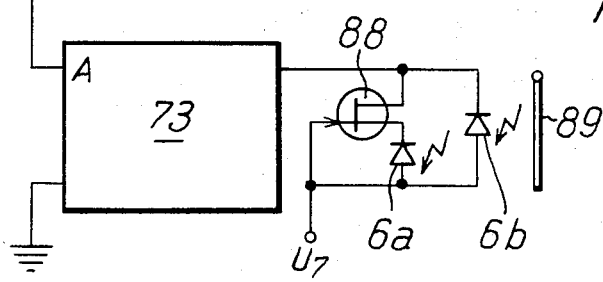
Figure 15:
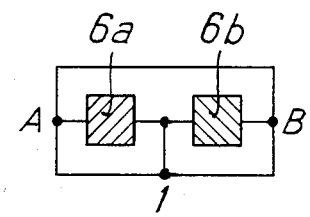

It can, however, also be advantageous to use different photoelectric transducers 6a, 6b for flash and normal exposure measurement, as shown in FIG. 15. These transducer elements can then be conventionally brought into action by a transistor 88 or by a cover flap 89 (FIG. 16).

It can be advantageous to connect the current amplifier circuit arrangement 73 described above after both the photoelectric transducer elements 6 and to logarithmically convert the current amplified by it in a calculator circuit 90 placed at the output A of the amplifier circuit 73, and to calculate it in with a voltage which is an analog of the film sensitivity. To fulfill this task, a calculator circuit 90 is schematically shown in FIG. 16, with a transistor 91, connected as a diode, a summing stage 92 following thereafter, a further logarithmic conversion transistor 93, the collector of which is connected to the output of the summing stage 92 and also an operational amplifier 94 connected to the emitter of the transistor 93. Respective capacitors 97 or 98, with switches 99 or 100, are present in the feedback banches 95, 96 of the operational amplifier 94; with them, different integration times for forming the shutter time or the flash duration can be switched in. The output $U_K$ of the circuit then acts conventionally on the shutter switch-off magnets of the camera or on the switch-off contact of the flash device.

In the embodiment of FIG. 3, the use, according to the invention, of the amplifier circuit in flash integration is shown. If it is desired to be able to feed in different film sensitivities with such a circuit arrangement, the threshold of a comparator which is connected to the output 34 of the circuit arrangement shown in FIG. 3 can be varied for this purpose.

Figure 17:
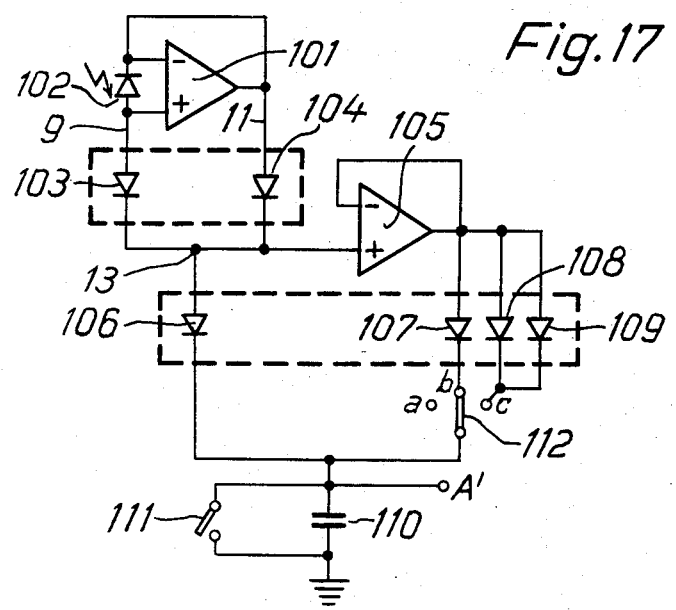
FIGS. 17–20 show further variations for the use of the circuit arrangement according to the invention.

However, if the threshold of the comparator are to remain fixed and the film sensitivity is to be taken into account in the gain of the current amplifier arrangement, a circuit arrangement can be chosen as shown in FIG. 17. Here an operational amplifier 101, a photoelectric transducer element 102, and diodes 103 and 104 correspond to the circuit arrangement of FIG. 2. However, a further current amplifier circuit arrangement composed of operational amplifier 105 and diodes 106-109 follows at the output 13 of this circuit. A capacitor 110 is connected to the output A' of this further amplifier circuit; it is charged when a switch 111 is opened at the beginning of the flash.

A switch 112, which can be placed in three positions a,b and c, is placed at the output of this further current amplifier circuit. If the switch 112 is in position a, the charging current for the capacitor 110 flows from the diode 102 via the diodes 103,104 and 106 and the amplification is $2 \times 1 = 2$. In position b of the switch 112 the diodes 103,104,106 and 107 are conducting and the amplification is $2 \times 2 = 4$. The switch position c results in diodes 103,104,106,108, and 109 becoming conductive, to produce an overall amplification of $2 \times 3 = 6$.

Figure 18:
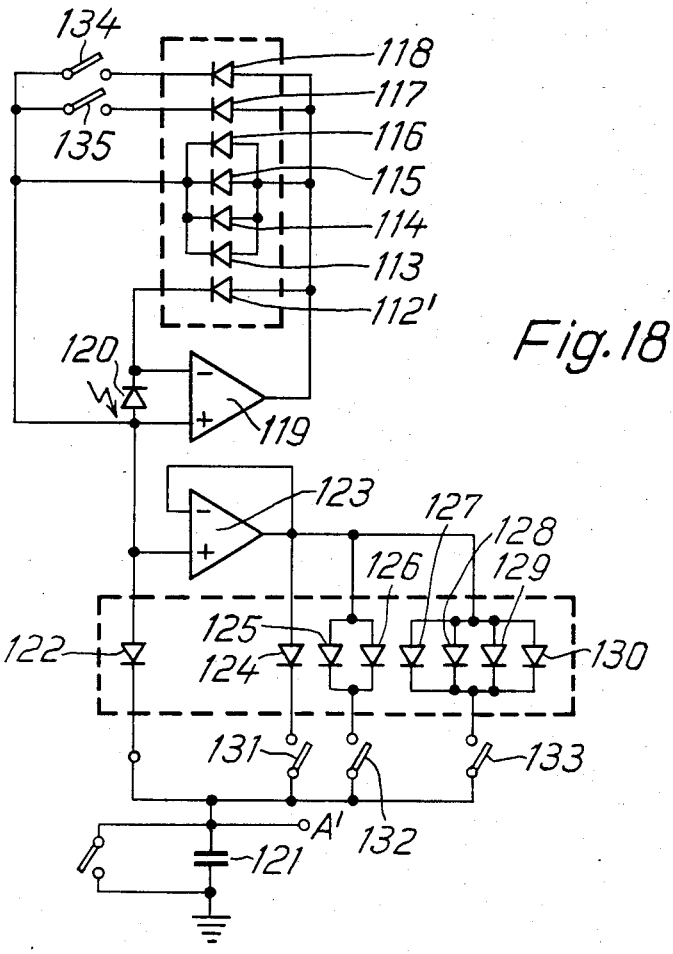

In the circuit shown in FIG. 18, the input stage corresponds in principle to the circuit arrangement described in FIG. 10. In this circuit, diodes 112, and 113-118 are connected, in the direction of the positive voltage, to the inputs of an operational amplifier 119, while a photoelectric transducer element 120 is connected between the inputs. Such a circuit arrangement is particularly advantageous with low supply voltages for charging a capacitor 121, since only one diode path, via a diode 112, is present between the input of the operational amplifier 119 and the capacitor 121. This diode 122 lies in the first current path of a further current amplifier circuit constructed according to the invention of amplifier 123 and diodes 124-130 and, connected by the noninverting input of operational amplifier 123 to the noninverting input of operational amplifier 119. The diodes 124-130 can be switched on or off in various combinations by switches 131-133. The amplification is thus varied in the ratio 1:2:4:8, corresponding to the variation of film sensitivity in 3° DIN steps.

The diodes 113-118 can also be switched on and off in various combinations by switches 134,135. The amplification is thus varied in the ratio 4:5:6, which approximately corresponds to a variation of the film sensitivity in 1° DIN steps.

Figure 19:
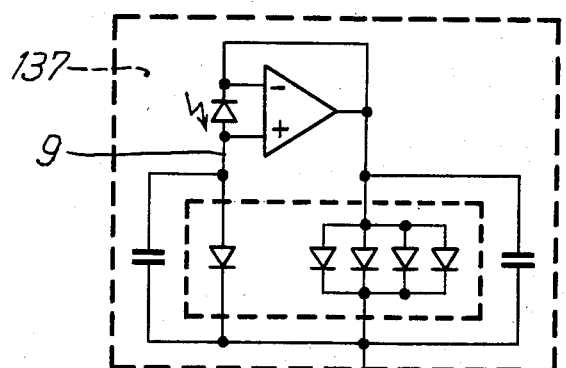

In the circuit shown in FIG. 19, an input amplifier circuit 137 corresponds to the current amplifier shown in FIG. 3. In it, the current is amplified by a operational amplifier by a factor 5. A second amplifier stage 138 consiting of an operational amplifier 139 with a parallel arrangement of a variable resistor 140 and a variable capacitor 141 in its first current path, and with parallel arrangement of a fixed resistor 142 and a capacitor 143 in its second a current path is connected between the non-inverting input of its operational amplifier 139 and the output of the input amplifier circuit 137. The current amplification of amplifier stage 138 depends on the ratio of the resistances 140 and 142. The current arising at the output A of the whole circuit can charge a capacitor 144, when this is released by a switch 145.

Figure 20:
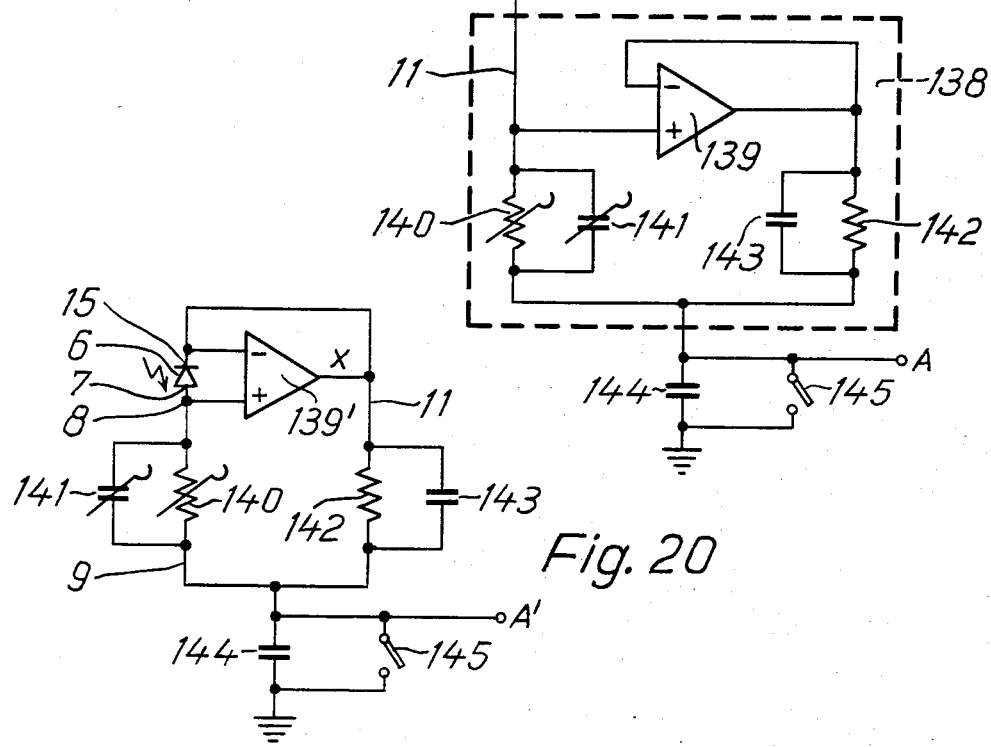

The circuit shown in FIG. 20 substantially corresponds in construction to the amplifier stage 138 of FIG. 19. The current to be amplified is supplied from a photoelectric transducer element 6, the leads 7, 15 of which are connected to the inputs of the operational amplifier 139'. Here also, as already explained with respect to FIG. 19, the current amplification depends on the ratio of the resistances 140 and 142. If, for example, the current amplification is to change in the ratio 1:2:4:8, the resistance 140 will be changed as follows:

Ratio 1:1 = resistance 140 = resistance 142

Ratio 1:2 = resistance 140 = 3 × resistance 142

Ratio 1:4 = resistance 140 = 7 × resistance 142

Ratio 1:8 = resistance 140 = 15 × resistance 142.

The capacitors 141 and 143 connected in parallel with the resistors 140, 142 have an important function. As is known, the flash intensity can vary in a ratio of 1:100. The capacitor 144 must, however, always have the same charging voltage until a comparator (not shown here) responds. If only the resistors 140 and 142 were provided for the charging, the voltage on these would have to change in the ratio 1:100. If this voltage is to be, on the one hand, unequivocally above the offset voltage of the operational amplifier 139 and, on the other hand, below the supply voltage, values for the supply voltage are obtained which can be realized only with difficulty.

According to the invention, the values of the capacitors 141 and 143 are in a ratio inversely proportional in magnitude to the values of the associated resistors 140 and 142. Furthermore, the value of capacitor 143 must be in ratio to the value of charging capacitor 144 such that the charging current for the capacitor 144 first flows, up to a part of the course of the flash, substantially via the capacitor 143. The capacitors 141 and 143 are of course restricted in this magnitude by the stability of the current amplifier stage.

If diode arrays are used instead of the resistors 140 and 142, the capacitors are to act to immediately reproduce rapid current changes (amplified). The magnitude of the supply voltage is less critical when diode arrays are used.

Figure 21:
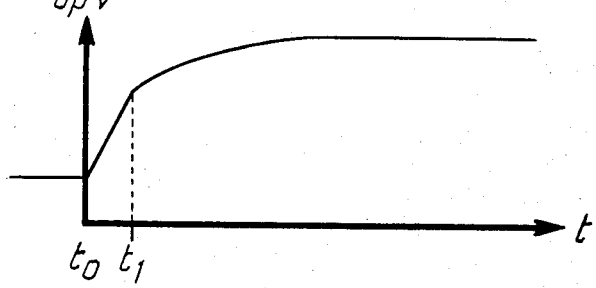
FIG. 21 shows a diagram of the change of voltage in an operational amplifier used in the circuit arrangement according to the invention.

The diagram of FIG. 21 shows a voltage change (slew rate) which could possibly arise at the output of an operational amplifier used in the circuits according to the invention. The diodes in the second current path of the current amplifier circuit arrangement only become conducting, and thus effective for current amplification, after the voltage reached at time $t_1$. Since the amplifier is however already to operate correctly at the time $t_o$, the capacitors take over the current-conducting function up to this moment.

What is claimed is:

1. A process for amplifying a photoelectric current generated by a photoelectric transducer and present at the input of a circuit arrangement including a feedback-coupled operational amplifier, comprising:
    (a) forming two virtually equal voltages by passing the current from said photoelectric transducer through a first impedance to provide a first voltage at an input of the amplifier and producing a virtually identical voltage at an output of said amplifier;
    (b) forming two current paths having a common connection point, the current in one current path being determined solely by the photoelectric transducer independently of said operational amplifier, while the current in the other current path is determined by impressing said virtually identical voltage at the output of said amplifier across a second impedance; and
    (c) adding the currents of the two current paths at said common connector point to produce an output current greater than that produced by said photoelectric transducer, said output current being a function of the ratio of the first and second impedances as well as the magnitude of the current generated by the photoelectric transducer.

2. A process for amplifying a photoelectric current generated by a photoelectric transducer and present at the input of a circuit arrangement including a feedback-coupled operational amplifier, comprising:
    (a) forming two virtually equal voltages by passing the current from said photoelectric transducer through a first impedance to provide a first voltage at an input of the amplifier and producing a virtually identical voltage at an output of said amplifier;
    (b) forming two current paths having a common connection point, the current in one current path being determined solely by the photoelectric transducer independently of said operational amplifier, while the current in the other current path is determined by impressing said virtually identical voltage at the output of said amplifier across a second impedance; and
    (c) adding the currents of the two current paths at the common connection point and feeding the resulting total current to a load connected to a fixed potential, said total current being a function of the ratio of the first and second impedances as well as the magnitude of the current generated by the photoelectric transducer.

3. A circuit arrangement for the amplification of a photoelectric current generated by a photoelectric transducer comprising:

a feedback-coupled operational amplifier having an input with two input terminals, said photoelectric current being present at said input;

a first current path including said photoelectric transducer and a first impedance, said first impedance being connected between one of said input terminals of the operational amplifier and a summing point to provide a voltage of said first input terminal such that a virtually identical voltage is produced at said output terminal;

a second current path including a second impedance connected between the output terminal of the operational amplifier and said summing point;

wherein the magnitudes of the two currents in the two current paths relative to each other are determined by the ratio of magnitudes of the first and second impedances, and the first current path is connected such that the current therein is solely determined by the photoelectric transducer at the input of the circuit arrangement, and wherein the total of the currents of both current paths is available at said common summing point.

4. A circuit arrangement according to claim 3, including wherein said photoelectric transducer is connected between said two input terminals of said operational amplifier and is operated in a short circuit mode.

5. A circuit arrangement according to claim 3, including a load connected between said common summing point and an output of the operational amplifier.

6. A circuit arrangement according to claim 3, wherein at least one of the resistances or impedances has a nonlinear current/voltage characteristic.

7. A circuit arrangement according to claim 6, wherein the resistances or impedances are formed by parts of a semiconductor array.

8. A circuit arrangement according to claim 3, wherein said resistances or impedances comprise capacitances and resistances in both current paths, the value of the ratio of said capacitances being inversely proportional to the value of the ratio of the resistances in the current paths.

9. A circuit arrangement according to claim 3, including an output of said circuit and an integrating capacitor provided in said output.

10. A circuit arrangement according to claim 9, including an amplifying follower circuit connected after the integrating capacitor.

11. A circuit arrangement according to claim 3, in combination with a photographic camera.

12. A circuit arrangement according to claim 11, including switching means in at least one of the current paths for setting a film-sensitivity value or other parameters utilized in controlling film exposure.

13. A circuit arrangement according to claim 12, wherein said resistances or impedances comprise diodes and wherein said switching means is connected to switch on or off at least one diode in at least one of the current paths in order to set the film-sensitivity or other parameters utilized in controlling film exposure.

14. A circuit arrangement according to claim 11, comprising switching means at the output for selectively switching between exposure metering and flash-integration.

15. A circuit arrangement according to claim 3 serving as preamplifier for a photoelectric exposure meter.

16. A circuit arrangement for the amplification of a photoelectric current generated by a photoelectric transducer comprising:

a feedback-coupled operational amplifier having an input with two input terminals, said photoelectric current being present at said input;

a first current path including said photoelectric transducer and a first impedance, said first impedance being connected between one of said input terminals of the operational amplifier and a summing point to provide a voltage of said first input terminal such that a virtually identical voltage is produced at said output terminal;

a second current path including a second impedance connected between the output terminal of the operational amplifier and said summing point;

wherein the magnitudes of the two currents in the two current paths relative to each other are determined by the ratio of magnitudes of the said first and second impedances, and the first current path is connected such that the current herein is solely determined by the photoelectric transducer at the input of the circuit arrangement, and wherein the total of the currents of both current paths is available at said common summing point for a load connected to a fixed potential.

* * * * *